United States Patent [19]
Smith et al.

[11] Patent Number: 5,888,925
[45] Date of Patent: Mar. 30, 1999

[54] HYDROGEN AND MOISTURE GETTER AND ABSORBER FOR SEALED DEVICES

[75] Inventors: Henry M. Smith, Overland Park, Kans.; James R. Schicker, Lee's Summit, Mo.

[73] Assignee: AlliedSignal Inc., Morris Township, N.J.

[21] Appl. No.: 26,831

[22] Filed: Feb. 20, 1998

Related U.S. Application Data

[60] Provisional application No. 60/004,449 Sep. 28, 1995.

Related U.S. Application Data

[63] Continuation-in-part of Ser. No. 718,203, Sep. 20, 1996, abandoned.

[51] Int. Cl.$^6$ .............................. B01J 20/00; H01J 7/18; C09K 3/00
[52] U.S. Cl. ....................... 502/400; 502/526; 252/181.1; 252/181.6; 252/194
[58] Field of Search ..................................... 502/400, 439, 502/526; 252/181.1, 181.6, 194

[56] References Cited

U.S. PATENT DOCUMENTS

| | | |
|---|---|---|
| 4,405,487 | 9/1983 | Harrah et al. . |
| 4,447,565 | 5/1984 | Lula et al. . |
| 5,244,707 | 9/1993 | Shores . |
| 5,304,419 | 4/1994 | Shores . |
| 5,401,536 | 3/1995 | Shores . |
| 5,624,598 | 4/1997 | Shepodd et al. . |

FOREIGN PATENT DOCUMENTS

| | | |
|---|---|---|
| 1103905 | 2/1968 | European Pat. Off. . |
| 1339524 | 12/1973 | European Pat. Off. . |
| WO 86 03056 A | 5/1986 | Germany . |
| 0 496 711 A2 | 7/1992 | Italy . |

OTHER PUBLICATIONS

PCT/Us 96/15540 International Search Report, completed Jan. 24, 1997.
Kayali, *Hydrogen Effects on GaAs Device Reliability*, International Conference on GaAs Mfg., 1996.
Camp et al., *Hydrogen Effects on Reliability of GaAs MMICs*, GaAs IC Symposium, 1989.
Chevallier et al., *Donor Neutralization in GaAs (Si) by Atomic Hydrogen*, Appl. Phys. Lett. 47, pp. 108–110, Jul. 1985.
Cotton et al., *Advanced Inorganic Chemistry*, pp. 994–995, Interscience Publishers, 1972.
Dennis, *Hydrogen Evolving Tendencies of Cable Fillers and Optical Fiber Coatings*, Rubber World, vol. 193, No. 2, Nov. 1985, pp. 26–29.

*Primary Examiner*—Glenn A. Caldarola
*Assistant Examiner*—In Suk Bullock
*Attorney, Agent, or Firm*—Frank B. Flink, Jr.; Stinson, Mag & Fizzell P.C.

[57] ABSTRACT

The present invention is a hydrogen getter and method for formulating and using the getter. This getter effectively removes hydrogen gas typically present in many hermetically-sealed electronic applications where the presence of such gas would otherwise be harmful to the electronics. The getter is a non-organic composition, usable in a wide range of temperatures as compared to organic getters. Moreover, the getter is formulated to be used without the need for the presence of oxygen. The getter is comprised of effective amounts of an oxide of a platinum group metal, a desiccant, and a gas permeable binder which preferably is cured after composition in an oxygen-bearing environment at about 150 to about 205 degrees centigrade.

12 Claims, No Drawings

HYDROGEN AND MOISTURE GETTER AND ABSORBER FOR SEALED DEVICES

This application is a continuation-in-part of application Ser. No. 08/718,203 filed Sep. 20, 1996, now abandoned. This application is also entitled to priority pursuant to provisional application Ser. No. 60/004,449 filed Sep. 28, 1995, entitled Hydrogen Getter.

The U.S. Government has rights in this invention pursuant to contract number DE-AC04-76-DP00613 with the United States Department of Energy.

BACKGROUND OF THE INVENTION

This invention generally relates to hermetically-sealed electronic devices and, more particularly, to compositions and methods for removing hydrogen and moisture from such devices.

Electronic assemblies for use in a variety of harsh environments, such as in space or marine applications, oftentimes are sealed from the outside conditions by use of gas-tight (hermetically sealed) containers. Such containers, while sealing out external dust, air and the like, trap in whatever is inside the devices.

Such hermetically sealed electronic assemblies generally contain semiconductor devices made from gallium arsenide (chemical symbol: GaAs) and/or indium phosphide (InP), and, in order to assure reliability and minimize failures in use, are test-operated at elevated temperatures (typically in the range of 125° C.) for a period of time (typically 1,000 hours), generally referred to as burn-in and life testing. At such conditions, a loss of performance was found both in alternating current (AC), including radio frequency (RF), operating characteristics, as well as direct current (DC) operating characteristics. It was determined that hydrogen gas was the primary cause of the performance degrading. This degradation was later observed to be common to most GaAs semiconductor devices utilizing the industry standard gate metallization structures. (Structures made with titanium/platinum/gold (Ti/Pt/Au) or titanium/palladium/gold (Ti/Pd/Au) gates)(Kayali, "Hydrogen Effects on GaAs Device Reliability," 1996). The source of the problem has been determined to be hydrogen gas that was absorbed in the package metals (Kovar, etc.) or hydrogen generated by other materials such as RF absorbers inside the device package. Hydrogen gas desorbed or generated inside hermetically sealed devices has no clear path for escape, and its concentration can easily rise to 1–2% of the gas volume in gas-filled devices during initial operation.

The exact mechanism by which hydrogen degrades device performance, and the path by which hydrogen reaches the active area of a device is not well understood and is still a subject of investigation. However, it appears that the platinum group metals Pt and Pd used in gate structures play an important role in the degradation process (Camp et. al., "Hydrogen Effects on Reliability of GaAs MMICs," GaAs IC Symposium, 1989). These metals are catalysts for the dissociation of molecular hydrogen to atomic hydrogen which can diffuse into other areas of the device. Earlier research on GaAs transistors identified the diffusion of atomic hydrogen directly into the channel area of the device where it neutralizes the silicon donors as a possible mechanism (Chevallier et al., "Donor Neutralization in GaAs(Si) by Atomic Hydrogen," Appl. Phys. Lett. 47, pg 108, July 1985.) Whatever the precise mechanism of device degradation by hydrogen may be, it is clear that it has a direct impact on the performance and reliability of GaAs devices used for high reliability applications.

One typical means of addressing this problem is the use of compositions which scavenge the hydrogen, generally referred to in the art and herein as "hydrogen getters" or, simply, "getters." Microcircuit devices, and, thus, the getters may be required to function in a vacuum, or be air or inert gas filled devices. Furthermore, they typically are required to function at temperatures ranging from −55° C. to 150° C., or higher. Space inside such devices is limited and, thus, it is highly preferable that the getter may be easily formed into a thin film or similar shape to conform to the inside of the sealed device. Further, to be a viable remedy, the getter should lower hydrogen concentrations to the low parts per million level (100 PPM or lower is preferable) over the operating temperature range of −55° to 150° C. where GaAs or similar devices are commonly used. It also must not desorb any other materials that might degrade device performance. Ideally, it should be easily manufactured to any desired physical dimensions and have a hydrogen capacity which could be tailored for any particular application.

One type of prior art hydrogen getter consists of alloys of metals such as iron, nickel, titanium, vanadium, zirconium, chromium, cobalt, the rare earth metals, and other metals and alloys which react with hydrogen to form metallic hydrides. These metallic getters typically require high temperatures exceeding 300° C. for activation and/or operation, and are frequently poisoned by the presence of oxygen, water vapor, or other contaminants such as chlorine gas and the like. Thus, this type of hydrogen getter may be undesirable where power or temperature constraints limit the hydrogen getter temperature or such contaminants are present. As with other metals, these alloys can be metal-worked to form thin films for insertion into sealed devices, although the metal-working machinery to perform such stamping may be unwieldy and shaping the alloys into complex forms may be difficult.

Another type of prior art hydrogen getter consists of a mixture of a platinum group metal, usually palladium for cost reasons, on a substrate, such as activated carbon, to increase active surface area and an unsaturated organic compound, such as diphenyl butadiyne or 1,4-bis (phenylethynyl) benzene. The platinum metal operates as a catalyst in the mixture to bind the hydrogen into the organics. This type of getter will function at low to moderate temperatures (less than 100° C.) and is not poisoned by oxygen or water vapor. However, these materials have significantly high vapor pressures at temperatures above 100° C. and may melt in that range, which may lead to material migration inside the device, which is very undesirable. Although this type of getter is not poisoned by the presence of water vapor, neither does it have any capabilities for absorption of water vapor. Any water vapor present or produced inside of an electronic enclosure is a potential source of corrosion, and circuit shorting and thus is undesirable. Typically, this type of getter is manufactured from a commercially-available palladium-on-activated-carbon powder which is mixed with the desired organic material in a jar mill or the like to form a finely-ground and well-mixed powder. The powder may then be molded into a pellet shape in a pellet maker. However, the resulting mixture is very brittle and, thus, is not suitable for molding into thin shapes.

SUMMARY OF THE INVENTION

It is thus an object of this invention to provide a hydrogen getter which will function in a vacuum or, alternatively in the presence of an inert gas, oxygen, air, and/or water vapor, in a wide range of temperature, from about −55° C. to 150° C. without being harmed thereby, to lower hydrogen levels to the equivalent of lower parts-per-million levels in sealed containers so that the components contained therein may effectively be protected from hydrogen gas.

In light of use of this hydrogen getter in cavities and as linings to electronic equipment, it is a further object of this invention to provide a hydrogen getter which is easily moldable into a variety of shapes and can be pressed or molded into electronic enclosures as a lining. The getter should not migrate in the enclosure at operating temperatures or produce dusting or flaking or evolve organic vapors.

It is a further object of this invention to provide a hydrogen getter of the type described which also functions as a desiccant in order to scavenge excess water in the enclosure and/or water produced by reaction of the hydrogen with the getter.

Further objects and advantages of the present invention will become apparent from the specification and claims described herein.

The composition of the present invention to satisfy these objects of the invention is an oxidized platinum group metal serving as both catalyst and oxygen source to convert hydrogen to water, combined with an appropriate desiccant, and a binder for holding the components in a matrix. Thus, the composition of the present invention comprises effective amounts of palladium monoxide or other oxides of platinum group metals as both a catalyst getter and a reactant along with effective amounts of an appropriate desiccant and effective amounts of a binder and hardener. The composition preferably is post-cured in an effective amount of an oxygen-containing gas, at an effective temperature, and for an effective amount of time. As used herein, "effective amounts" of palladium monoxide or other oxides of platinum group metals indicate the percentages or amounts of the oxide components to satisfactorily remove the hydrogen anticipated to be present in a particular environment. Similarly, as used herein, "effective amounts" of a desiccant indicate the percentages or amounts of the particular desiccant component used, to satisfactorily remove the water anticipated to be present in a particular environment. Further, as used herein, "effective amounts" of a binder and hardener indicate the percentages or amounts of binder effective to stabilize and make workable the combined ingredients, metal oxide, desiccant and binder. As used herein, "effective amounts" of a hardener mean sufficient hardener to stabilize the combined ingredients while minimizing outgassing of unwanted components or binding of reactive oxides. Similarly, "effective amounts" of oxygen, temperature, and time to post-cure means sufficient oxygen, at a sufficiently high temperature, and for a sufficient tine to assure the gettering capacity is maintained for the intended use of the getter.

DESCRIPTION OF THE INVENTION

In a vacuum or in an inert gas, no oxygen will be present to react with hydrogen. However, it is known that certain metal oxides, particularly those of the platinum group metals (ruthenium, rhodium, palladium, osmium, iridium, and platinum), as well as copper (II) oxide and silver (I) oxide are reduced to the metal by exposure to hydrogen gas (F. A. Cotton, G. Wilkinson, "Advanced Inorganic Chemistry," pg. 994, Interscience Publishers, 1972). Thus, oxides of platinum (group metals act as both catalyst and reactant in the presence of hydrogen gas. An excellent example to this gettering reaction for palladium monoxide (PdO) is shown below:

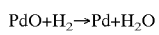

It is noted that PdO is the preferred getter, primarily because of cost reasons. However, other oxides of platinum group metals such as platinum, rhodium, rhenium, osmium and iridium may also be used for this purpose. These reactions are essentially irreversible and proceed easily even at temperatures as low as −55° C. and above 200° C. Ag(I) decomposes at 160° C., for that reason, is undesirable in the present invention. Cu(II) is anticipated to be sufficiently slow in reaction that it is considered undesirable in the present invention. However, if these constraints are acceptable in a particular application, oxides of Ag(I) and Cu(II) may be acceptable in a getter.

However, such oxides alone are not suitable for use as getters because, among other things, the reaction above produces water which would also present a problem to sealed electronic circuits. Addition of an appropriate desiccant medium to collect resulting water, such as a molecular sieve, removes the water produced. Molecular sieve desiccant is preferred because of its capacity for water, typically 22 percent by weight, and lack of swelling or dusting. However, the platinum group oxides and desiccant alone are not suitably moldable for use in sealed containers.

The combination of platinum group oxides and desiccant mixed into a gas permeable binder, in proper proportions forms a moldable material which will both react with hydrogen and capture the water produced. For example, a room temperature vulcanized (RTV) silicone is gas permeable and stable at temperatures below −55° C. and above 200° C.

Combined in proper proportions, the platinum metal oxides, desiccant and binder will catalyze the reaction between hydrogen and oxygen and the desiccant sieve will adsorb the water produced by the reaction. This getter system requires no activation for the reaction of hydrogen with oxygen, but can be activated for water absorption by conventional means such as baking at high temperatures (i.e., above 150° C.), using vacuum, or inert gas purge. After such baking, the system should not only be dry, but will also not evolve organic vapors which might harm microcircuit components. The system will function in microcircuits even during the initial "burn-in" of the device at temperatures up to 150° C. In particular, a system of RTV silicone, molecular sieve desiccant and PdO will function up to at least 200° C. without softening and will produce no volatile organic compounds that might damage sensitive components.

The described getters for both the air-filled devices and the evacuated/inert gas-filled devices are moldable materials that can be cast and cured in any desired shape and size, including thin films (less than 0.010 inches thick ) for use in microcircuit devices where little space is available. They may also be cast in place in such a device, eliminating the need for any adhesive bonding.

PREFERRED EMBODIMENT

The preferred embodiment of the composition of the present invention, for cost, availability and similar considerations, is palladium monoxide and a molecular sieve desiccant, such as zeolite, mixed in appropriate proportions and added as a homogeneously mixed filler to a curable silicone elastomer to form a matrix. This combination can be molded to any desired dimensions and the amount of PdO and desiccant may be adjusted to handle the anticipated amount of hydrogen and moisture for any particular application. The molecular sieve desiccant will scavenge the water produced by the reaction of the metal oxide with hydrogen. The silicone elastomer is an excellent binder for the oxide and desiccant, and has very high permeability to both hydrogen and water vapor. When properly postcured, the getter is stable up to 200° C. and does not outgas any organic volatiles that might prove detrimental to a sealed device.

Given the nature of the present invention, it is intuitive that there is no theoretical lower limit to the amount of PdO that could be used in the present invention. Rather, changing the percentage amounts of PdO simply changes the rate at which hydrogen is absorbed and the total amounts of hydrogen absorption which can occur. The total theoretical capacity of the present invention for hydrogen is a simple chemical balance of the available moles of oxygen contained in the PdO, reacted with the hydrogen. For practical reasons, the amount of active ingredients, PdO and desiccant, will typically be maximized in order to minimize the total amount of present invention needed to remove the hydrogen anticipated. However, as discussed below, high proportions of solids, the PdO or other platinum group oxides and the desiccant, will make the resulting mix unacceptably stiff and hard to mold. Thus, if typically between about 10 percent and about 30 percent by weight of the total composition of the present invention getter is platinum group oxides, the getter will be sufficiently reactive, and should still be acceptably moldable.

It was discovered that, although various forms of palladium monoxide function in the present invention, the gettering capacities of palladium monoxide formed by particular processes is preferred. It appears that palladium monoxide formed as a result of a process by which palladium is dissolved in a strong acid, such as aqua regia, and refined by forming salts thereof in a refining process to ultimately form a refined palladium monoxide powder is significantly more active in the present invention getters than palladium monoxide formed by decomposition of palladium nitrate ($Pd(NO_3)_2$) (referred to below as "decomposition palladium monoxide") (comparing both getters without post-curing with air as discussed herein.) The gettering capacities of palladium monoxide in the present invention (without post-curing) formed by the former process are roughly two to three times as effective at removing hydrogen than palladium monoxide formed by the latter process. It has been found, however, that generally the loss in capacity of the decomposition palladium monoxide getter can be recovered by the post-curing process discussed below. In addition, the decomposition palladium monoxide should be cleaned to remove unwanted nitrate contamination. Thus, depending upon cost, availability, and post-curing considerations, use of the palladium monoxide formed by the salt refining technique may be preferred to palladium monoxide formed by decomposition of nitrates.

The preferred desiccant for the present invention is a molecular sieve desiccant, generally for capacity and size stability reasons. Molecular sieve desiccant is available in several size ranges from 3 Å to 15 Å, any of which is expected to work effectively. However, the 3 Å is generally the most preferred size because it characteristically will absorb few types of molecules except for water. The proportion of desiccant used is related to the amount of water expected to be produced. For example in a vacuum application with only hydrogen expected, the only water produced would be from reaction with the platinum group oxides. A 3 Å sieve has a nominal 22 percent by weight water capacity. For PdO, with a molecular weight of 122, water with molecular weight of 18 will be produced which is equivalent to 15 percent by weight of the original PdO. Thus, for each unit weight of PdO, 15/22 or 0.68 units weight of 3 Å is required. For most applications, excess desiccant is desirable, however, to avoid potential free water in the enclosure. Thus, the portion of desiccant required will typically be from about 5 to about 35 percent by weight of the total mixture.

As noted in the following examples, workability of the preferred embodiment of the present invention prior to curing decreased significantly at about 45 percent by weight of the RTV silicone used—type GE 615 as manufactured by General Electric Company of Waterford, N.Y., (GE 615). Thus, the practical limits for binder appear to be from about 85 percent to about 35 percent by weight of the total composition of the present invention, including platinum group metal oxide, desiccant, and binder.

As discussed below in Example 15, the amount of hardener used in the binder can have a significant impact upon the effectiveness of the getter. Basically, use of the manufacturer's recommended amount of hardener when used with the RTV silicone binder severely inhibits the ability of the hydrogen getter to operate. It appears that the amounts of binder typically used in the RTV silicone to assure a complete binding reaction in all parts of the temperature range and for various mixing techniques produce excess amounts of hardener in the final product. This excess hardener may be a hydrogen generator and, thus, the excess hardener has a direct impact upon the effectiveness of the present invention. As indicated in the cited example, basically the minimum amount of hardener to form a stable binder should be utilized to maximize the gettering capability of the resulting composition of the present invention. The preferred mix of ingredients using the GE 615 RTV silicone was about 95 parts resin to about 5 parts hardener.

In mixing the composition of the present invention, especially in light of the need to minimize the amount of hardener utilized in any binder, the gettering material and desiccant should preferably be mixed prior to introduction into the binder. The binder resin should be thoroughly mixed with the setting agent or hardener prior to introduction of the amounts of desiccant and getter material. In this fashion the hardener will be as thoroughly mixed with the binder as possible prior to introduction of the getter material so as to minimize the contact of the getter material with free unreacted hardener components. The amounts used should be amounts effective to satisfactorily perform the hydrogen gettering desired. Upon mixing of the components, the mixture should be promptly shaped or molded into the desired shape prior to the hardener acting. As noted in the following examples, the mix is then preferably cured by heating, followed by activation of the desiccant.

It is noted that, although oxides of the palladium group metals, including PdO, will catalyze hydrogen and oxygen directly, the catalytic reaction proceeds more slowly than an equivalent reaction with a nonoxidized palladium group metal. For this reason, small amounts of a palladium group metal may be added to the present invention in instances when oxygen is expected to be present and a faster reaction is desired. Typically, this will be a commercially available palladium on a substrate such as activated carbon. It is also noted that various other additives could be utilized along with the present invention to perform specific functions in particular situations. For example, as noted herein, the present invention works effectively in the presence of RF absorbers, typically ferrous particles in a matrix. Thus, in particular instances, the present invention could be combined with an RF absorber substance compatible with the binder to form a combination RF absorber and hydrogen getter. One advantage of such a combination would be additional space savings in the sealed enclosures.

As shown in examples 16–19, below, the efficacy of the present invention hydrogen getter at elevated temperatures in a vacuum has been found to degrade with time if the getter is not post-cured in an oxygen-rich environment at elevated temperature. (Typically this oxygen curing will be accomplished as a separate step after the getter is molded and initial setup of the RTV has occurred. Hence this operation typically will be a "post-cure". However, it is also acceptable to begin the oxygen curing during initial setup of the RTV. The present invention includes either approach.) Basically, it is hypothesized that oxygen from the oxide of platinum-group metals is depleted by combination with carbon atoms provided by the silicon binder due to catalytic action of the platinum-group metal (e.g., palladium); referred to herein as "self-catalytic degradation." Although this reaction appears generally to be self-limiting, the ultimate capacity of the getter material which is not post-cured in an oxygen atmosphere is less than the theoretical capacity of such getter material. Thus, although the present getter material maintains efficacy at lower temperatures and in oxygen-rich environments, getter materials first exposed to elevated temperatures in a vacuum or an oxygen depleted environment tend to have undesirably reduced capacities due to self-catalytic degradation. Additionally, as noted above, the present invention getter formed with decomposition palladium monoxide exhibits reduced capacity regardless of temperature exposure.

Typical applications of the present invention or getter material are for use inside of hermetically-sealed electronic enclosures which provide either a vacuum or inert gas atmosphere around the electronics. Further, it is typical for such electronics to be "burned in" for a period of time at elevated temperatures at around 150° C. or greater. In such conditions, it is anticipated that the getter material will lose a substantial portion of its capacity. Therefore, it is preferred that getter material be post-cured in an oxygen rich environment prior to use in such environments for a period of time sufficient to avoid the effects of this depletion.

Post-curing in an oxygen rich environment at elevated temperatures for a period of time may be performed in a variety of gasses, for a variety of times, and at a variety of temperatures and be expected to achieve adequate results. The preferred oxygen-rich environment for cost reasons is air. Various combinations of hyper-oxygenated air, or oxygen with other gasses, preferably inert, could also be used. Further, in very limited circumstances it is anticipated that a partial pressure oxygen atmosphere could be utilized. However, a near pure oxygen atmosphere, especially at higher pressures is anticipated to cause undesirable degradation in the silicon matrix itself, and likely should be avoided.

Regarding post-cure temperature, it is noted that RTV silicon compositions such as the GE 615, are known to be stable to about 200° C. Beyond about 200° C. a degradation in the silicon matrix occurs and, therefore, post-cure operations should be limited to about 200° C. Tests have also revealed that with an increased post-cure temperature in air, the effectiveness of post-cure operations is increased. See Table 18. Therefore, the preferred post-cure operations will be performed at about 200° C. In particular, tests have revealed effective post-curing without apparent silicone matrix degradation at 204° C. Therefore, 204° C. appears to be the most preferred post-cure temperature for commercial operations. It is noted that curing occurs, albeit at a slow rate at temperatures around 150° C. which may be desirable in some instances where, for example other temperature-sensitive components are involved.

Regarding the post-cure time, a direct correlation has been found between the amount of time in post-cure operations and the effectiveness of the post-cure operation. Again as shown in Table 18, an approximately inverse linear relationship is found for the percent of carbon dioxide produced versus cure time for times up to 72 hours. In particular, at a 72 hour cure time at 204° C. only about 8% of the amount of carbon dioxide is found in extended duration tests as compared to a control post-cure operation in vacuum. See Table 18. It is preferred, therefore, in commercial applications for a cure to occur at the maximum reasonable elevated temperature at which degradation of the silicon binder does not occur for a period of time sufficient to produce a getter with a hydrogen capacity with acceptable properties. For getters with a very high capacity demand, long cure times approaching 72 hours or greater in air at temperatures elevated to around 200 to 205 degrees centigrade appear to be most preferred. For commercial production, shorter cure times around 24 to 50 hours at temperatures approaching about 204 degrees centigrade appear acceptable. Depending upon the availability of an oxygen enhanced atmosphere, shorter cure times may be utilized to the same effect with oxygenated curing atmospheres. However, it is believed that accelerated degradation of the silicone matrix may occur near 200° C. at elevated oxygen levels and, therefore, the maximum cure temperature is set by testing the specific RTV in a specific gas mixture to find the most desirable curing temperature. Of course even shorter cure times and lower temperatures may be appropriate where the getter is being utilized in an enclosure containing some air or oxygen which would prevent the carbon dioxide degradation described herein, or where the getter will not be exposed to elevated temperatures.

Various characteristics, results, and embodiments of the current invention are further illustrated by the following nonlimiting examples:

EXAMPLE 1

A formulation of the present invention using PdO was prepared with 15% by weight PdO, 45% by weight 3Å molecular Sieve (3 Å), and 40% by weight GE 615. Except as noted, PdO used in all examples is salt deposited PdO, Catalog No. 99210, manufactured by Alfa Aesar; a Johnson Matthey Co., 30 Bond St., Ward Hill, Mass., 01835-0747.

A 20-gram sample of the above formulation was hand-mixed. The material was very viscous at this level of solids loading (60%), so mixing was difficult, and the mixture would not flow easily. The mix was pressed to a 0.010 inch thick sheet and cured at 75° C. for about 4 hours. It was then placed into the vacuum oven at 185° C. and below 0.1 mm Hg pressure for final cure and drying of the molecular sieve powder.

Sample size was 1.5 grams, and the amount of hydrogen injected was 0.75 cc. A 150 cc volume test chamber was used. Results are shown in Table 1:

TABLE 1

| Time | % $H_2$* | Pressure, torr | Action |
|---|---|---|---|
| 8:10:00 am | | 761 | Initial nitrogen pressure |
| 8:18:30 | | 765 | Added 0.75 cc hydrogen |
| 8:20:30 | 0.7574 | 761 | Removed 0.5 cc gas sample |
| 8:26:30 | | 759 | Pressure reading |
| 8:47:30 | | 758.5 | Pressure reading |
| 8:48:30 | 0.0192 | 756 | Removed 0.5 cc gas sample |

TABLE 1-continued

| Time | % H$_2$* | Pressure, torr | Action |
|---|---|---|---|
| 1:03:30 pm | | 756 | Pressure reading |
| 1:03:45 | 0.0020 | 753 | Removed 0.5 cc gas sample |

*Unless otherwise noted, all % and ppm gas readings herein are per volume.

By the end of the test period, the hydrogen concentration had dropped to approximately 20 ppm, which is near the detection limit for the hot wire detector used in the Perkin-Elmer Company of Norwalk, Conn. gas chromatograph (Model Sigma 2000 GC) utilized for the sample analysis shown in Table 1.

On day 2 of this test at 8:20:15 am, pressure was 752 torr. At 8:21:00 am, 0.0011% H$_2$ was detected upon removal of 0.5 cc gas sample at pressure of 750 torr.

On day 3 of this test, H$_2$ detection was switched to a Model 3202 Trace Gas Analyzer made by Valco Instruments Co, Inc, of Houston Tex. (VICI GC) for more sensitivity. On this day, results at 11:31 am showed 0.739 ppm hydrogen and 743 torr pressure upon removal of a 1.0 cc gas sample.

On day 9 of this test, results using the V1C1 GC were at 9:35 am, 0.070 ppm hydrogen detected at 739 torr upon removal of a 1.0 cc gas sample. This test showed significant continued long-term scavenging of H$_2$ by the present invention getter.

EXAMPLE 2

In order to test acceptable mix viscosity, two more formulations of getter were made. The first new formulation was 15% by weight PdO, 40% by weight 3 Å Mol. Sieve, 45% by weight GE 615 Silicone. A 20 gram sample of this formulation was hand-mixed and pressed into a 0.010 inch thick sheet. It was observed that this mixture was still very viscous, and would not flow easily.

The second new formulation was 15% by weight PdO, 30% by weight 3 Å Mol. Sieve, 55% by weight GE 615 Silicone. A 20-gram sample of this composition was hand-mixed and pressed into a 0.010 inch thick sheet. This mix was less viscous and would flow, although slowly.

Both mixes were cured for 4 hours at 75° C. and then put in the vacuum oven at 185° C. and less than 0.1 mm Hg pressure for final cure and desiccant drying. Both mixes cured properly and performed satisfactorily as getters. However, it appears that for minimal molding characteristics, the amount of binder, such as GE 615, in the present invention should be maintained above about 35% by weight. Preferably, higher levels of binder, about 55–65 by weight, increase material moldability. If molding characteristics are not a significant concern, further reductions in the amount of binder may be acceptable.

EXAMPLE 3

Further testing on the efficacy of the present invention proceeded by preparation of a 1.38 gram of a test of formulation of 15% by weight PdO, 30% by weight 3 Å, and 55% by weight GE 615, prepared as noted in Example 2. This sample was put in a 150 cc volume test chamber, which was evacuated and then backfilled with nitrogen gas and tested with the addition of 0.75 cc hydrogen gas added through a septum. The resulting data is shown in Table 2 below:

TABLE 2

| Time | % H$_2$ | Pressure, torr | Action |
|---|---|---|---|
| 10:13:45 am | | 770 | Initial nitrogen pressure |
| 10:25:45 | | 774 | Added 0.75 cc hydrogen gas |
| 10:27:45 | 0.5153 | 770 | Removed 0.5 cc gas sample |
| 10:41:30 | | 767 | Read pressure only |
| 10:55:45 | 0.0137 | 764 | Removed 0.5 cc gas sample |
| 2:25:45 pm | 0.0016 | 762 | Removed 0.5 cc gas sample |
| 2:40:45 | 0.377 ppm* | 757 | Removed 1.0 cc gas sample |
| 11:57:00 am (next day) | | 757 | Pressure Reading only |
| 11:58:10 am | | 753 | Removed 1.0 cc gas sample, no reading, GC malfunction |
| 12:47:00 pm | Non-detect | 748 | Removed 1.0 cc gas sample. ppm H$_2$ below peak threshold (PT)) |
| 1:08:00 pm | 0.091 ppm | 743 | Removed 1.0 gas sample, dropped Peak Threshold (PT) level to .015 ppm |

*Switched to the VICI GC for greater sensitivity; results for hydrogen are in ppm rather than percent as above.

EXAMPLE 4

One problem with hydrogen getters involved producing getters which are sufficiently thin for use in small component applications. This example documents an attempt to make 0.005 inch thick sheet sample.

A 20 gram sample of a 15% PdO, 30% 3 Å, 55% GE 615 formulation was hand-mixed and pressed to a thickness of 0.005 inches using steel plates separated by 0.005" shim stock. The samples were not very uniform, and many holes appeared. They seem to be due to surface tension of the mix. Three samples were cast and placed in a 75° C. oven for 3 hours for the initial cure. When removed from the oven, the samples were found not to be fully cured, and were very difficult to remove from the Teflon cloth because they tore very easily. Two of the samples were removed and put in the vacuum oven at 1 85° C. and less than 0.1 mm Hg pressure for final cure and drying. The third sample was left in the 75° C. oven overnight.

The sample cured at 75° C. overnight was improved in cure state. It was placed in the 185° C. oven for final cure. The other two samples that had been cured overnight at 185° C. in vacuum were placed in sample jars and put into the glove box pending reaction testing. These samples appeared to be fully cured indicating that the present invention satisfies the need to reliably produce thin getters.

EXAMPLE 5

One primary use for hydrogen getters is for use with radio frequency (RF) absorbers. This is because RF absorber material typically is a major source of hydrogen outgassing into electronic enclosures. The RF absorber is necessary in these enclosures to eliminate spurious radio frequency signals which could disrupt the proper operation of the electronics in the enclosure. Thus, it is important for hydrogen getters to operate effectively in the presence of RF absorber materials.

In order to test effectiveness of the present invention in the presence of RF absorbers, a 2-inch (5.1 cm.) by 3-inch (7.6 cm.) strip 0.010-inch (0.025 cm.) thick sample of getter material 15% by weight PDO, 25% by weight 3 Å, 60% by weight GE 615, was hand-mixed and pressed to the indicated thickness, cured, and cut to size. A 3-inch (7.6 cm.) by 4-inch (2.2 cm.) strip which was 0.020 inch (0.051 cm.) thick of RF absorber material was loaded into 110 cc stainless steel vessels. The hydrogen content was analyzed by gas chromatography at various intervals. The vessels were filled with dry nitrogen at 1100 torr and maintained at 150° C. during the test. Two industry standard RF absorbers were tested, both metal impregnated silicone binder absorbers. Two absorber control vessels were used with each absorber formulation, as well as an empty vessel for reference of hydrogen desorption for metals. Also, a sample of each absorber with the indicated amount of getter was produced. The results were as shown in Table 3 below.

described in Example 5 above (a 15% PdO, 25% 3 Å molecular sieve, 60% GE 615). The material tested was a 1.5 inch×2 inch strip (3.8 cm.×5.1 cm) nominally 0.020 inch (0.051 cm) thick. The samples were aged 984 hours at the temperatures noted in Table 5 inside sealed stainless steel vessels. Samples were then placed in 150 cc glass vessels and tested at room temperature ("RT," nominally 71° F./22° C.). A 2.5 cc portion of hydrogen was injected into each sample vessel at time=0. The results are summarized in Table 5.

TABLE 3

Hydrogen Concentration (PPM)

| Elapsed Time (Hours) | Absorber Formulation A | Absorber Formulation A | Absorber Formulation A with Getter | Absorber Formulation B | Absorber Formulation B | Absorber Formulation B with Getter | Empty Vessel (control)* |
|---|---|---|---|---|---|---|---|
| 0 | 0 | 0 | 0 | 0 | 0 | 0.000 | 0.0 |
| 140 | 1660 | 1350 | 0.060 | 344 | 361 | 0.073 | 12.70 |
| 237 | 2531 | 1971 | 0.027 | 716 | 680 | 0.052 | 25.39 |
| 408 | 3312 | 2653 | 0.057 | 1168 | 1091 | 0.030 | 36.53 |
| 672 | 4397 | 3578 | 0.020 | 2017 | 2009 | 0.020 | no data |
| 1008 | 5215 | 5140 | 0.065 | 3424 | 3131 | 0.047 | 408 |

*Control simulates hydrogen desorption from metals.

Based upon these results, the present invention functions well to remove unwanted hydrogen in the presence of RF absorbers.

EXAMPLE 6

A moisture absorption test was performed utilizing a getter sample prepared the same as the getter sample used in Example 5 above (a 15% PdO, a 25% 3 Å, 60% GE 615) formed into a 2 inch×2 inch (5.1 cm×5.1 cm.) strip nominally 0.020 inch. (0.051 cm) thick. These samples were activated in an evacuated oven at 150° C. for 16 hours. The test samples were then inserted into a humidity chamber maintained at 35% relative humidity (within +2 to −15% relative humidity), and 75° F. plus or minus 5° F. (24° C. plus or minus 3° C.). The results are shown as percent weight gain in the samples and are summarized below in Table 4.

TABLE 4

Test Part Weight, grams

| Elapsed Time (Hours) | Sample #1 | Sample #2 | Sample #3 | Sample #4 |
|---|---|---|---|---|
| 0 | 2.69 | 2.90 | 2.77 | 3.14 |
| 1 | 2.74 | 2.95 | 2.82 | 3.19 |
| 2 | 2.77 | 2.97 | 2.85 | 3.21 |
| 3 | 2.79 | 3.00 | 2.86 | 3.23 |
| 5 | 2.81 | 3.02 | no data | no data |
| 20 | no data | no data | 2.92 | 3.32 |
| 21 | 2.84 | 3.05 | test complete | test complete |
| 23 | 2.85 | 3.05 | test complete | test complete |
| 24 | test complete | test complete | test complete | test complete |
| Total Gain | 0.16 | 0.15 | 0.15 | 0.18 |
| Percent Gain | 5.9% | 5.2% | 5.4% | 5.7% |

Theoretical weight gain for water absorption is 5.5% by weight based upon a nominal capacity of the 3 Å molecular sieve of 22 percent by weight. The test results confirm the theoretical desiccating capacity of the present invention.

EXAMPLE 7

Tests were run on hydrogen absorption on aged getter material of the present invention mixture compounded as

TABLE 5

Hydrogen Concentration (PPM)

| Elapsed Time (minutes) | RT | 60° C. | 95° C. | 125° | Gas Chromatograph |
|---|---|---|---|---|---|
| 0 | 16667 | 16667 | 16667 | 16667 | Initial calculated concentration |
| 60 | 2402 | 2267 | 1950 | 2416 | Perkin-Elmer 0.5 cc injection |
| 120 | 490 | 464 | 505 | 519 | Perkin-Elmer 0.5 cc injection |
| 180 | 172 | 123 | 161 | 127 | Perkin-Elmer 0.5 cc injection |
| 240 | 37 | 94 | 38 | 21 | Perkin-Elmer 0.5 cc injection |
| 300 | 0.962 | 0.591 | 0.206 | 0.406 | VICI-GC 5.0 cc injection |

Results indicate no loss of gettering capacity with aged material of the present invention.

EXAMPLE 8

Example 8 is a compilation of hydrogen absorption rate testing performed at room temperature on a sample of the material of the present invention as formulated in Example 5 (15% PdO, 25% 3 Å molecular sieve, 60% by weight GE 615) cut into 1 inch×4 inch strips (2.5 cm×10.2 cm), 0.010 inches (0.025 cm) thick. Samples were inserted to 150 cc volume stainless steel vessels filled with dried nitrogen. Two cc of hydrogen were added at time=0. Results are summarized in Table 6 below.

TABLE 6

Hydrogen Concentration (PPM)

| Elapsed Time (minutes) | Sample #1 | Sample #2 | Gas Chromatograph |
|---|---|---|---|
| 0 | 13333 | 13333 | Initial calculated concentration |
| 2 | 12873 | 12989 | Perkin-Elmer 0.5 cc injection |
| 15 | 1813 | 2222 | Perkin-Elmer 0.5 cc injection |
| 30 | 320 | 409 | Perkin-Elmer 0.5 cc injection |
| 60 | 44 | 74 | Perkin-Elmer 0.5 cc injection |
| 120 | 1.878 | 2.500 | VICI-GC 5.0 cc injection |
| 240 | 0.057 | 0.089 | VICI-GC 5.0 cc injection |

Results indicate a high rate of absorption, a reduction in more than 99 percent of available hydrogen in 1 hour.

EXAMPLE 9

Example 9 is a set of kinetics data for a certified hydrogen leak rate. Material tested is a mixture as shown in Example 5 (15% PdO, 25% 3 Å molecular sieve, 60% GE 615) cut into a 1 inch×6.2 inch strip (2.5 cm×15.7 cm), 0.010 inches (0.025% cm) thick glued to an equal size sheet of aluminum foil. The material was inserted into 150 cc glass test vessels with a $4 \times 10^{-7}$ cc (STP)/sec certified hydrogen leak. The vessels were nitrogen filled at 800 torr. Gas samples were removed at times noted and analyzed for hydrogen concentration by gas chromatography. The results are summarized in Table 7.

TABLE 7

Hydrogen Concentration (PPM)

| Elapsed Time (Hours) | Room Room Temperature | Elapsed Time (Hours) | 60° C. | Elapsed Time (Hours) | −10° C. | Elapsed Time (Hours) | 95° C. |
|---|---|---|---|---|---|---|---|
| 0 | 0.000 | 261.0 | 5.041 | 330 | 14.320 | 596.67 | 2.576 |
| 115.5 | 7.030 | 288.3 | 4.808 | 357.5 | 13.469 | 610.2 | 2.118 |
| 140.6 | 7.775 | 309.0 | 5.590 | 480 | 17.260 | 681.3 | 2.390 |
| 162.5 | 7.840 | 980.6 | 5.195 | 499.2 | 17.250 | | |
| | | 1008.2 | 5.762 | | | | |
| Average | 7.548 | Average | 5.339 | Average | 15.993 | Average | 2.254 |

Results show a long-term stability of the present invention gettering rate for a set leakage rate and, also, a direct dependance of gettering rate versus temperature. This also indicates effective gettering of the present invention over a wide range of temperatures, beyond the temperatures tested.

EXAMPLE 10

In order to confirm that the theoretical capacity of the getter was consistent at varying levels of PdO, a sample of 25% PdO, 20% 3 Å molecular sieve, 55% GE 615 was prepared. At this ratio, the theoretical capacity of the mixture calculated as described herein, is 45.75 cc atm/gm. (Herein, "atm" indicates at standard temperature and pressure—STP.) Experimental value derived from data was 44.6 cc atm/gm. This close correlation indicates that the actual hydrogen capacity of the present invention should be very close to the theoretical capacity over generally any ratio of component mixtures.

EXAMPLES 11, 12 and 13

Examples 11, 12 and 13 were performed utilizing 5% by weight PdO, 5% by weight Pd on C, 30% by weight 3 Å molecular sieve, and 60% by weight GE 615 mixed as shown below.

First, the PdO and Pd on carbon were combined mechanically by placing 5.1467 grams of PdO and 5.1540 grams of 5% Pd on carbon catalyst in a small ceramic ball mill jar with ceramic grinding cylinders and ball-milled overnight. This produced a finely divided uniform mixture of the two materials, PdO and 5% Pd on carbon.

Next, 40 gram sample was hand mixed using 4.0 grams of the mixed PdO/5% Pd on carbon mixture, 12.0 grams of 3 Å molecular sieve powder, and 24 grams of the premixed GE 615 RTV silicone with hardener.

After hand-mixing, the formulation was pressed into two approximately 16 gram sheets about 0.010 inches thick using 0.010 shim stock and Teflon cloth. The sheets were cured at 75° C. for 4 hours. The sheet samples were then removed from the Teflon cloth, and placed in a vacuum oven at 185° C. and less than 0.1 mm Hg pressure for final cure and drying. The samples were cured overnight in the vacuum oven.

Tests in Examples 11–13 were performed at room temperature, approximately 70° F. (21° C.).

EXAMPLE 11

A sample of about 8 grams of this PdO/Pd test formulation (5% PdO, 5% Pd on C, 30% 3 Å and 60% GE 615) was placed in the 150 cc test vessel. The air was evacuated and the volume backfilled with nitrogen ($N_2$). A 15 cc sample of $H_2$ gas was injected into the volume through a septum, and the pressure observed versus time. The results are shown below in Table 8:

TABLE 8

| Time | % $H_2$ | Pressure, torr | Actions |
|---|---|---|---|
| 8:20 am | | 724 | Starting $N_2$ pressure |
| 8:21:30 | | 796 | Added 15 cc hydrogen gas |
| 8:23:30 | | 761 | Pressure reading only |
| 8:29:30 | | 745 | Pressure reading only |
| 8:36:30 | | 734 | Pressure reading only |
| 8:51:30 | | 730 | Pressure reading only |
| 8:51:40 | 0.896 | 728 | Removed 0.5 cc for analysis |
| 9:02:00 | | 727 | End test #1 |

EXAMPLE 12

The 150 cc test vessel was evacuated and refilled with clean nitrogen ($N_2$) for a second test, using same sample as test #1. Results are shown in Table 9.

TABLE 9

| Time | % H$_2$ | Pressure, torr | Actions |
| --- | --- | --- | --- |
| 9:04:40 am | | 753 | Refilled with nitrogen |
| 9:05:40 | 0.1449 | 751 | Removed 0.5 cc gas sample |
| 9:15:00 | 0.2025 | 748 | Removed 0.5 cc gas sample |
| 9:26:30 | | 747 | Starting N$_2$ pressure |
| 9:27:00 | | 820 | Added 15 cc hydrogen gas |
| 9:29:00 | | 795 | Pressure reading only |
| 9:34:00 | | 778 | Pressure reading only |
| 9:42:00 | | 768 | Pressure reading only |
| 9:57:00 | | 760 | Pressure reading only |
| 9:57:15 | 1.846 | 758 | Removed 0.5 cc for analysis |
| 1:26:30 pm | | 750 | Pressure reading Only |
| 1:26:45 | 1.0393 | 748 | Removed 0.5 cc for analysis |

The PdO Test #2, was allowed to sit two days, and two more gas samples were taken on the third day as shown below in Table 10:

TABLE 10

| Time | % H$_2$ | Pressure, torr | Actions |
| --- | --- | --- | --- |
| 8:27:00 | | 741 | Pressure reading |
| 8:27:15 | 0.8199 | 739 | Removed 0.5 cc for analysis |
| 8:33:50 | 0.8212 | 737 | Removed 0.5 cc for analysis |

The hydrogen concentration appeared stable at approximately 0.8 percent. The 30 cc hydrogen added to this sample has used about 41 percent of the hydrogen gettering capability of this sample. The gettering rate appears to be slow at this level of loading.

EXAMPLE 13

In this test, we used amounts of PdO test formulation and H$_2$ that more clearly represents the expected level of loading that might be seen in a microcircuit. We used a 1.6 gram sample of the test formulation (5% PdO, 5% Pd on C, 30% 3 Å and 60% GE 615) in a 150 cc test vessel with a smaller 0.75 cc hydrogen loading. Results are as shown in Table 11 below:

TABLE 11

| Time | % H$_2$ | Pressure, torr | Actions |
| --- | --- | --- | --- |
| 9:00 am | | 760 | Initial N$_2$ pressure |
| 9:10 | | 757 | Wait for stable pressure |
| 9:10:15 | ND | 755 | Removed 0.5 cc for analysis |
| 9:20:15 | | 759 | Added 0.75 cc hydrogengas |
| 9:22:15 | 0.7497 | 755 | Removed 0.5 cc gas sample |
| 9:49:15 | | 751.5 | Pressure reading only |
| 9:50:15 | 0.0124 | 749 | Removed 0.5 cc gas sample |
| 1:50:30 pm | 0.0023 | 746 | Removed 0.5 cc gas sample |
| 03:30 | 0.0015 | 744 | Removed 0.5 cc gas sample |
| 8:03:30 am (next day) | 0.0015 | 744 | Removed 0.5 cc gas sample |

This test demonstrates very effective removal (gettering) of hydrogen with the PdO/Pd combined. The test vessel reached approximately 23 ppm hydrogen, approximately 0.3 percent of the initial level, in about 4.5 hours. The detection limit of the gas chromatograph (GC) being used was 15 ppm.

EXAMPLE 14

Purity of the components of this hydrogen getter is of great importance. Of particular interest is the level of residual contaminates that remain on the palladium monoxide as purchased from a chemical supplier. Early aging tests performed with palladium monoxide purchased by catalog number 11040 from Alfa Aesar—Johnson Mathey identified a direct link to the amount of observed methane generated to the level of chlorine contaminate on the palladium monoxide. Ion chromatography on the PdO identified a chloride ion value well in excess of 1000 parts per million. Specific requests were made to several vendors to have the chloride ion count eliminated or reduced to maximum levels no greater than 200 parts per million.

Of concern to manufacturers of hermetically sealed electronic containing devices such as hybrid microcircuits is the identification of outgassing components from polymeric materials. Tests for outgassing are defined in Mil-Std-883, Method 5011.4. Gas analysis of the internal volume of present invention getter samples undergoing accelerated aging was performed to identify, if any, gas species generated from the prepared getter material. This analysis performed by gas injection into calibrated gas chromatographs identified a significant level of methane gas. The conclusion drawn from this analysis was that there were impurities in the mix components of the getter.

Alfa Aesar successfully met the 200 parts per million requirement with two different preparations of palladium monoxide. Sample A (new catalog stock number 99210) met the 200 parts per million maximum level and tested to a consistent hydrogen capacity of 27 cc-atm per gram hydrogen in the prepared getter, in close agreement with the theoretical capacity of 27.4 cc-atm per gram. Repeated accelerated aging samples confirmed the removal of methane generated gas. Tests performed on other catalog number samples from various manufacturers were not as successful. The hydrogen capacity test repeatedly tested to between 10.5 and 13.4 cc-atm per gram. The accelerated aging samples however, showed no methane generation. An investigation of the total ionic contaminates using ion chromatography between Alfa Aesar sample "A" and the lower performing samples ("B") from various vendors identified a nitrate ion (NO$_3^+$) was present in large amounts (greater than 1000 ppm) in sample "B" but was not detected in sample "A."

Based on the above analysis we have concluded that the removal of chloride ions from palladium monoxide is required for elimination of methane gas from the prepared getter. The method of palladium monoxide preparation which removes or reduces these chlorine levels must not use a preparation process that leaves nitrate ions present. Subsequent attempts at removing the nitrate, washing, leaching, etc., from the nitrated contaminated palladium monoxide (the "B" samples)were made. Although the nitrate contamination was successfully removed, such removal had no apparent effect upon the gettering capacity of the "B"samples.

The chloride ion concentration present in the samples of Catalog No. 99210 from Alfa Aesar is characteristic of palladium monoxide prepared by a salt precipitation technique which makes use of an acid dissolved palladium and then repetitive salt precipitations to isolate the palladium monoxide thus produced. The amount of residual chloride ion is dependent upon the amount of refining performed to remove these contaminants from the palladium monoxide produced. Production of palladium monoxide by this method is well known to one experienced in the art. The refining technique would not contaminate the samples with nitrates, however.

In comparison, palladium monoxide prepared by decomposition of palladium nitrate (Pd(NO$_3$)$_2$) would leave trace amounts of the nitrate in the sample. Thus, it was determined that the other commercial samples of palladium monoxide were produced by this second technique.

Poor performance of the second method of production of the palladium monoxide is opined to result from the difference in the crystalline structure of the palladium monoxide and binding of the molecules in the structure. As indicated, the palladium monoxide produced by the second technique is usable as a hydrogen getter, albeit at a lower activity level.

EXAMPLE 15

In initial testing of the hydrogen capacity of the present invention getter, a considerable variation in the capacity value of the getter was observed, with all samples being significantly lower than the theoretical capacity. A getter containing 15% by weight PdO has a theoretical hydrogen capacity of 27.45 cc-atm per gram, based upon each mole of PdO reacting with a mole of hydrogen gas. The hydrogen capacity test is performed by exposing a sample of the present invention getter to an excess of hydrogen in a known calibrated volume and observing the change in pressure as the reaction proceeds. Capacity values were observed ranging from about 22 cc-atm/gram to as low as 15 cc-atm/gram. Upon investigation, it was discovered that most room temperature vulcanizing vinyl addition cure silicones, such as GE 615 RTV, are normally mixed with a large excess (20–50% ) of silane (—Si—H) group-containing curing agent to hasten cure at room temperature. These excess silane groups in the cured material are a significant source of hydrogen evolution, as they react with water or other hydroxy group containing materials. See W. E. Dennis, D. A. Sierawski & D. N. Ingebrigston, "Hydrogen Evolving Tendencies of Cable Fillers and Optical Fiber Coatings," *Rubber World*, Volume 193, No. 2, Nov. 1985, pp 26–29. We concluded that these excess silane groups were generating hydrogen which reacted with the PdO during the cure and post-cure processing of the getter at elevated temperatures.

To test this hypothesis, we made several 0.010" thick film samples of GE 615 with varying ratios of resin to cure agent. The manufacturer's recommended ratio of resin to silane curing agent is 90/10. We prepared unfilled samples of silicone using this ratio as well as samples using ratios of 93/7, 94/6 and 95/5. After curing for 16 hours at 100° C., the infrared absorbance peak areas of the residual silane groups were measured. The samples were then postcured for 24 hours at 170° C. and then again for 24 hours at 200° C., with IR absorbance measurements made after each treatment. The results are shown in Table 12 below.

TABLE 12

Si-H GROUP IR ABSORBANCE PEAK AREA IN ARBITRARY UNITS for GE 615 RTV SILICONE

| Treatment | Resin/Cure Agent Ratio | | | |
|---|---|---|---|---|
| | 90/10 | 93/7 | 94/6 | 95/5 |
| 16 hrs @ 100° C. in air oven | 31.3 | 13.6 | 12.0 | 7.8 |
| Add 24 hrs @ 170° C. in vacuum oven | 12.3 | 4.99 | 2.93 | 1.33 |
| Add 24 hrs @ 200° C. in vacuum oven | 6.11 | 2.00 | 1.83 | 1.11 |

An examination of the data in the above table reveals two significant facts. First, a lowering of the silane cure agent does indeed reduce the residual silane group concentration left in the cured silicone polymer. Second, thermal treatment also reduces the residual silane concentration. Both these effects should therefore reduce the potential hydrogen evolution by the silicone polymer, allowing the getter to retain a capacity closer to the theoretical value after processing. Subsequent capacity testing indicated that the lower cure agent formulations did indeed have higher capacities, with the 95/5 mix yielding essentially the theoretical value of approximately 27 cc-atm/gram.

We also performed an aging test at 150° C. of samples of 90/10 and 95/5 mix ratios, wherein the evolved hydrogen versus time was measured. The samples were cured for 16 hours at 100° C. and postcured for 24 hours at 150° C. Two samples of each mix were aged in stainless steel sample vessels from which gas samples could be withdrawn for analysis. Each sample vessel was evacuated and backfilled with dry nitrogen to 1100 torr prior to the start of the aging test. Two blank steel vessels were also included in the test so that the results could be corrected for the small amount of hydrogen that would be evolved from the steel itself. The results are shown in the Table 13, below.

TABLE 13

| | Hydrogen Concentration (%) | | | | | |
|---|---|---|---|---|---|---|
| Time (hrs) | 90/10 14.163 g | 90/10 10.974 g | 95/5 11.963 g | 95/5 15.618 g | blank 0 g | blank 0 g |
| 92 | 1.65 | 1.24 | ND | ND | ND | ND |
| 428 | 2.04 | 1.55 | 0.032 | 0.027 | 0.009 | 0.010 |
| 840 | 2.28 | 1.82 | 0.028 | 0.033 | 0.021 | 0.018 |
| 1464 | 2.49 | 1.94 | 0.035 | 0.043 | 0.035 | 0.041 |
| 2808 | 3.03 | 2.40 | 0.081 | 0.111 | 0.095 | 0.095 |

The results in Table 13 confirm that the hydrogen evolution from the silicone polymer may be reduced by lowering the amount of silane cure agent used to prepare the mix. The hydrogen values from the 95/5 ratio mix differ little if any from that seen in the empty vessels. Based on the results of these tests and the tests of hydrogen capacity, all getter samples for all other examples herein, except for examples 11–13, were prepared using the 95/5 mix ratio and the best results for GE 615 is about that ratio. Examples 11–13 used a 90/10 mix ratio. For other binders, similar tests would need to be performed to find the preferred mix of resin and hardener to minimize unreacted binder.

EXAMPLE 16

During the development and testing of the present invention hydrogen getter, two significant observations were made concerning the performance of the getter in vacuum or inert (oxygen free) atmospheres at elevated temperatures. The first was that in sealed static tests in nitrogen at temperatures of 125° C. or higher, significant quantities of carbon dioxide were generated. This is illustrated in the test samples shown in Table 14, where it is seen that carbon dioxide ($CO_2$) evolution increases with both time and temperature. The second observation was that long post-cures (over 40 hours) in vacuum at 150° C. or higher resulted in a decrease in hydrogen capacity of the getter. This effect is shown in Table 15, where it is clear that capacity decreases with time in vacuum at 150° C. Both of these observations suggested that a reaction was occurring between the PdO getter component and the methyl groups of the polydimethylsiloxane binder, resulting in carbon dioxide generation and a decrease in the amount of PdO available to react with hydrogen. This is logical because the PdO is the only source of oxygen and the methyl groups on the silicone polymer the only source of carbon in the getter system. Moreover, Pd is a strong catalyst and PdO is a strong oxidant. Thus, in close contact with the silicone binder, the PdO catalyzes and oxidizes portions of the surrounding binder at elevated temperatures.

TABLE 14

Carbon Dioxide Out-Gassing

| | Test Conditions | | | % CO₂ by Gas Chromatography | | | |
|---|---|---|---|---|---|---|---|
| Sample | Soak Temp (°C.) | Dimensions L x W x H (mm) | Mass, (g) | after 24 hours | after 140 hours | after 480 hours | after 1992 hours |
| 14A | 60 | 50.8 x 38.1 x 0.533 | 1.4467 | 0.0352 | 0.0285 | 0.0221 | 0.0254 |
| 14B | 95 | 50.8 x 38.1 x 0.559 | 1.4715 | 0.0671 | 0.0758 | 0.1027 | 0.2260 |
| 14C | 125 | 50.8 x 38.1 x 0.559 | 1.4876 | 0.1423 | 0.4539 | 0.9231 | 1.7511 |
| 14D | 150 | 50.8 x 38.1 x 0.521 | 1.3625 | 0.3553 | 1.5560 | 2.0571 | 2.7083 |

TABLE 15

Hydrogen Capacity Measurements After Vacuum Post Cure

| | Vacuum Post Cure Condition | | Hydrogen Capacity |
|---|---|---|---|
| SAMPLE | Time, hrs | Temp, °C. | cc-atm/g |
| 15A | 16 | 150 | 48.15 |
| 15B | 40 | 150 | 28.58 |
| 15C | 64 | 150 | 33.60 |
| 15D | 88 | 150 | 18.87 |
| 15E | 100 | 150 | 11.39 |

EXAMPLE 17

It was hypothesized that, if the reaction were left for sufficient time, the self-catalytic degradation reaction should be self-limiting, because the available methyl groups near any PdO particle would become depleted, forming a shell or barrier of reacted polymer that would limit further reaction. This "matrix depletion" effect, however, appeared to occur too late in vacuum or nitrogen atmospheres to preserve enough PdO to leave an effective hydrogen capacity for the getter at temperatures of 150° C. or higher. It further was hypothesized that, whereas inert or vacuum atmospheres did not form a barrier layer around PdO particles in time to preserve capacity, post-curing the getter system in an oxygen containing atmosphere, like air, at elevated temperatures (150° to 200° C.) might cause carbons available to react in the polymer to become reacted while preserving the full capacity of the PdO. Initial experiments as shown in Table 16 compared the capacity of getter samples post-cured at 150° C. in vacuum with identical samples post-cured in air. The results in Table 16 demonstrate that post-curing in air preserves capacity (i.e., PdO stoichiometry), as opposed to a significant loss in capacity with vacuum post-curing. Similar results were obtained where air post-curing was done at 174° C., as shown in Table 17.

Further, similar results were obtained when decomposition palladium monoxide was air post-cured. Air post-cured decomposition palladium monoxide was tested for hydrogen capacity and found to have capacity equivalent to the other type of air post-cured palladium monoxide getter. Indeed, the air post-cured palladium monoxide reacts with hydrogen somewhat faster than the other type of palladium monoxide getter, apparently due to it's fine particle size. However, it is noted the test specimens of the decomposition palladium monoxide getter had unacceptably high levels of nitrates for use in many types of hermetically-sealed electronics enclosures.

TABLE 16

Hydrogen Capacity Comparison Between An Air Circulating Oven Post Cure And A Vacuum Oven Post Cure At Various Time Durations.

| | Oven Post Cure Conditions | | | H₂ Capacity |
|---|---|---|---|---|
| SAMPLE | Time, hrs | Oven Type | Temp °C. | cc-atm/g |
| Air-1 | 16 | Air | 150 | 52.46 |
| Vac-1 | 16 | Vacuum | 150 | 50.47 |
| Air-2 | 40 | Air | 150 | 50.61 |
| Vac-2 | 40 | Vacuum | 150 | 47.87 |
| Air-3 | 112 | Air | 150 | 51.21 |
| Vac-3 | 112 | Vacuum | 150 | 28.82 |
| Air-4 | 16 | Air | 150 | 53.16 |
| Vac-4 | 16 | Vacuum | 150 | 51.98 |
| Air-5 | 40 | Air | 150 | 51.48 |
| Vac-5 | 40 | Vacuum | 150 | 51.88 |
| Air-6 | 112 | Air | 150 | 52.77 |
| Vac-6 | 112 | Vacuum | 150 | 42.56 |

TABLE 17

Hydrogen Capacity Measurements After Air Circulating Oven Post Cure

| | Air Post Cure Condition | | Hydrogen Capacity |
|---|---|---|---|
| SAMPLE | Time, hrs | Temp, °C. | cc-atm/g |
| 17A | No Age | Ambient | 49.67 |
| 17B | 18.5 | 174 | 50.75 |
| 17C | 42.5 | 174 | 49.09 |
| 17D | 90.5 | 174 | 56.29 |

EXAMPLE 18

In addition to demonstrating that air post-curing preserves hydrogen capacity, a study was also done to show that it greatly lowered carbon dioxide evolution at elevated temperatures. Samples were air post-cured at 174° C. and 204° C. for 24, 48, and 72 hours. These samples, along with a no post-cure control (sample 18G) were sealed in stainless steel tubes in nitrogen and aged at 150° C. for 2829 hours. Gas samples for carbon dioxide concentrations were taken at 23, 67, 312 and 2829 hours. The data are shown in Table 18, where it is shown that post-curing in air also greatly decreased the generation of carbon dioxide, thus supporting the hypothesis that post-curing in air at elevated temperatures forms a barrier to reaction of PdO with the silicone binder.

TABLE 18

Carbon Dioxide Out-Gassing Analysis

Test Conditions
Test Temperature = 150° C.

| SAMPLE | Post Cure Type, (Air/Vac); Time, (hrs); Temp (°C.) | Dimensions L × W × H (mm) | Mass, (g) | % CO$_2$ by Gas Chromatography | | | |
|---|---|---|---|---|---|---|---|
| | | | | after 23 hours | after 67 hours | after 312 hours | after 2829 hours |
| 18A | Air 24 hrs @ 174° C. | 43.7 × 73 × 0.51 | 2.9272 | 0.0388 | 0.0448 | 0.1755 | 0.6546 |
| 18B | Air 24 hrs @ 204° C. | 43.7 × 73 × 0.51 | 2.9957 | 0.0389 | 0.0484 | 0.1074 | 0.4404 |
| 18C | Air 48 hrs @ 174° C. | 43.7 × 73 × 0.51 | 3.0673 | 0.0306 | 0.0410 | 0.0936 | 0.4204 |
| 18D | Air 48 hrs @ 204° C. | 43.7 × 73 × 0.51 | 2.9105 | 0.0256 | 0.0287 | 0.0477 | 0.2508 |
| 18E | Air 72 hrs @ 174° C. | 43.7 × 73 × 0.51 | 2.9526 | 0.0297 | 0.0357 | 0.0776 | 0.3632 |
| 18F | Air 72 hrs @ 204° C. | 43.7 × 73 × 0.51 | 2.8946 | 0.0221 | 0.0259 | 0.0405 | 0.1618 |
| 18G | Vac 7 hrs @ 150° C. | 43.7 × 73 × 0.51 | 3.0639 | 0.2048 | 0.5104 | 1.0360 | 2.0699 |

EXAMPLE 19

The primary advantage of this air post-curing process improvement is that it greatly increases the thermal stability of the getter system, even for long times at temperatures of 150° C. or higher. This is very important, since most gallium arsenide device producers use a "burn in" of the devices at 125°–150° C. for 300 or more hours as a final quality control step. This process ensures that the "burn-in" step will not result in a decrease in the capacity of the HMC hydrogen getter in the device. Table 19 shows the capacity of several samples that were air post-cured for 48 hours at 204° C., providing ample evidence that hydrogen capacity of the getter is preserved.

TABLE 19

Hydrogen Capacity For Air Post Cured Material Samples

| | Post Cure Time & Temp | | Hydrogen capacity |
|---|---|---|---|
| Lot ID | Hours | °C. | cc-atm/g |
| 19A | 48 | 204 | 50.91 |
| 19B | 48 | 204 | 49.43 |
| 19C | 48 | 204 | 45.06 |
| 19D | 48 | 204 | 46.79 |
| 19E | 48 | 204 | 47.65 |
| 19F | 48 | 204 | 47.08 |
| 19G | 48 | 204 | 45.98 |
| 19H | 48 | 204 | 50.10 |
| 19I | 48 | 204 | 50.81 |
| 19J | 48 | 204 | 49.17 |
| 19K | 48 | 204 | 49.53 |
| 19L | 48 | 204 | 50.52 |

What is claimed is:

1. A hydrogen gas absorber comprising effective amounts of oxides of platinum group metals to remove hydrogen from a particular environment, effective amounts of a desiccant to absorb water produced from the reaction of hydrogen with said oxides, effective amounts of a gas permeable binder to satisfactorily hold said oxides and said desiccant in a matrix formed by said binder, and wherein the absorber has been cured in gas with effective amounts of oxygen and at an effective temperature and for an effective time sufficient to stabilize the absorber from self-catalytic degradation.

2. The absorber as claimed in claim 1 wherein the amounts of said oxides are from about 10 to about 30 percent by weight, the amounts of said desiccant are from about 5 to about 35 percent by weight, the amounts of said binder are from about 85 to about 35 percent by weight, and the absorber has been cured in air at a temperature from about 150 degrees centigrade to about 204 degrees centigrade for at least about 24 hours.

3. The absorber as claimed in claim 2 further comprising effective amounts of a radio frequency absorbing substance to absorb unwanted radio frequency waves.

4. The absorber as claimed in claim 2 wherein said oxides are produced by a salt precipitation technique and contains less than about 200 parts per million by weight of chlorine, wherein said desiccant is a molecular sieve desiccant, and wherein said binder is a room temperature vulcanized silicone.

5. The absorber as claimed in claim 4 further comprising effective amounts of a platinum group metal to accelerate reaction of hydrogen gas with unreacted oxygen.

6. A hydrogen gas absorber comprising from about 10 to about 30 percent by weight palladium monoxide, from about 5 to about and 35 percent by weight of a molecular sieve desiccant, and from about 85 to about 35 percent by weight of a gas permeable binder, said palladium monoxide and said desiccant held in a matrix formed by said binder and wherein the absorber has been cured in air at a temperature from about 170 degrees centigrade to about 204 degrees centigrade for at least about 24 hours.

7. The absorber as claimed in claim 6 wherein said oxides are produced by a salt precipitation technique and contains less than about 200 parts per million by weight of chlorine, wherein said desiccant is a molecular sieve desiccant, wherein said binder is a room temperature vulcanized silicone consisting of a resin reacted with a cure agent, and wherein the ratio of said cure agent to said resin is such that the amount of said cure agent that is unreacted residual is minimized.

8. The absorber as claimed in claim 7 further comprising effective amounts of a radio frequency absorbing substance to absorb unwanted radio frequency waves.

9. The absorber as claimed in claim 7 further comprising effective amounts of a platinum group metal to accelerate reaction of hydrogen with unreacted oxygen.

10. A method of manufacturing a hydrogen absorber comprising the step of:

mixing effective amounts of oxides of platinum group metals to remove hydrogen from a particular environment, effective amounts of a desiccant to absorb water produced from the reaction of hydrogen with said oxides, and effective amounts of a gas permeable binder to satisfactorily hold said oxides and said desiccant in a matrix formed by said binder, and curing said absorber in a gas with effective amounts of oxygen and at an effective temperature and for an effective time sufficient to stabilize the absorber from self-catalytic degradation.

11. The method as claimed in claim 10 wherein the amounts of said oxide of platinum group metals are from about 10 to about 30 percent by weight and the amounts of said desiccant are from about 5 to about and 35 percent by weight and the amount of said gas permeable binder is from about 85 to about 35 percent by weight and wherein the absorber has been cured in air at a temperature from about 150 degrees centigrade to about 204 degrees centigrade for at least about 24 hours.

12. The method as claimed in claim 11 wherein said oxides are produced by a salt precipitation technique and contains less than about 200 parts per million by weight of chlorine, wherein said desiccant is a molecular sieve desiccant, and wherein said binder is a room temperature vulcanized silicone consisting of a resin reacted with a cure agent and wherein the ratio of said cure agent to said resin is such that the amount of said cure agent that is unreacted residual is minimized.

* * * * *